(12) United States Patent
Liao et al.

(10) Patent No.: US 9,406,575 B2
(45) Date of Patent: Aug. 2, 2016

(54) PIXEL ARRAY SUBSTRATE AND DISPLAY PANEL

(71) Applicant: Chunghwa Picture Tubes, LTD., Taoyuan (TW)

(72) Inventors: Tzu-Chiang Liao, Taoyuan County (TW); Chih-Wen Lai, Nantou County (TW)

(73) Assignee: Chunghwa Picture Tubes, LTD., Taoyuan (TW)

( * ) Notice: Subject to any disclaimer, the term of this patent is extended or adjusted under 35 U.S.C. 154(b) by 121 days.

(21) Appl. No.: 14/164,281

(22) Filed: Jan. 27, 2014

(65) Prior Publication Data
US 2015/0170981 A1    Jun. 18, 2015

(30) Foreign Application Priority Data

Dec. 12, 2013   (TW) .............................. 102145915 A

(51) Int. Cl.
*H01L 21/66*    (2006.01)
*H01L 27/12*    (2006.01)

(52) U.S. Cl.
CPC .............. *H01L 22/32* (2013.01); *H01L 27/124* (2013.01)

(58) Field of Classification Search
CPC .............................. H01L 22/32; H01L 27/124
See application file for complete search history.

(56) References Cited

U.S. PATENT DOCUMENTS

| 6,362,032 | B1 | 3/2002 | Kim et al. |
| 8,502,946 | B2 | 8/2013 | Liu et al. |
| 2008/0030668 | A1* | 2/2008 | Komaju ........................ 349/151 |
| 2009/0140269 | A1* | 6/2009 | Song ............................... 257/88 |
| 2010/0195028 | A1* | 8/2010 | Kubota et al. ................. 349/106 |

FOREIGN PATENT DOCUMENTS

| CN | 101082718 | 12/2007 |
| TW | 201007311 | 2/2010 |

OTHER PUBLICATIONS

"Office Action of Taiwan Counterpart Application", issued on Apr. 8, 2015, p. 1-p. 4, in which the listed references were cited.
"Office Action of China Counterpart Application", issued on May 12, 2016, p. 1-p. 9.

* cited by examiner

*Primary Examiner* — Matthew W Such
*Assistant Examiner* — Krista Soderholm
(74) *Attorney, Agent, or Firm* — Jianq Chyun IP Office

(57) ABSTRACT

A pixel array substrate including a substrate and pixel units arranged in an array on the substrate is provided. Each pixel unit includes a TFT having a source, a gate, and a drain, a pixel electrode electrically connected to the drain, a common electrode, an insulation layer, and a test electrode. The pixel electrode is located between the common electrode and the substrate. The common electrode has slits that expose the pixel electrode. The insulation layer is located between the common electrode and the pixel electrode and has a contact hole exposing the pixel electrode. The test electrode and the common electrode belong to the same film layer, and the test electrode is separated from the common electrode. The contact hole is filled with the test electrode, and the test electrode is electrically connected to the drain. A display panel including the pixel array substrate is also provided.

14 Claims, 9 Drawing Sheets

PIXEL ARRAY SUBSTRATE AND DISPLAY PANEL

CROSS-REFERENCE TO RELATED APPLICATION

This application claims the priority benefit of Taiwan application serial no. 102145915, filed on Dec. 12, 2013. The entirety of the above-mentioned patent application is hereby incorporated by reference herein and made a part of this specification.

BACKGROUND OF THE INVENTION

1. Field of the Invention

The invention relates to a display panel and its pixel array substrate; more particularly, the invention relates to a fringe field switching (FFS) display panel and its pixel array substrate.

2. Description of Related Art

Nowadays, multimedia technologies have been well developed, which mostly benefits from an advancement of semiconductor devices and display apparatuses. As for displays, display panels with superior features such as high definition, good space utilization, low power consumption, and no radiation have gradually become the mainstream of the market. In order to ensure the favorable display quality of the display panels, various display panels characterized by wide view angles have been developed, e.g., in-plane switching (IPS) display panels, multi-domain vertical alignment (MVA) display panels, fringe field switching (FFS) display panels, and so on. The FFS display panel not only has the wide view angle but also features little color shift, and therefore the FFS display panel has gained popularity.

Nevertheless, in the conventional FFS display panel, the pixel electrode of each pixel unit is covered by a common electrode and an insulation layer which both overlay the pixel electrode, and the thin film transistor (TFT) of each pixel unit is also covered by the insulation layer. Therefore, in the event that the FFS display panel is unable to display images with favorable quality, testers are not apt to find the cause of such unfavorable display because it is not easily to test the TFT of each pixel unit.

SUMMARY OF THE INVENTION

The invention provides a pixel array substrate and a display panel in which thin film transistors (TFT) are apt to be tested.

In an embodiment of the invention, a pixel array substrate that includes a substrate and a plurality of pixel units is provided. The pixel units are arranged in an array on the substrate. Each of the pixel units includes a TFT, a pixel electrode, a common electrode, an insulation layer, and a test electrode. The TFT has a source, a gate, and a drain. The pixel electrode is electrically connected to the drain of the TFT. The pixel electrode is located between the common electrode and the substrate. The common electrode has a plurality of slits exposing the pixel electrode. The insulation layer is located between the common electrode and the pixel electrode and has a contact hole exposing the pixel electrode. The test electrode and the common electrode belong to the same film layer, and the test electrode is separated from the common electrode. The contact hole of the insulation layer is filled with the test electrode, and the test electrode is electrically connected to the drain of the TFT.

In an embodiment of the invention, a display panel that includes said pixel array substrate, an opposite substrate arranged opposite to the pixel array substrate, and a display medium located between the pixel array substrate and the opposite substrate is provided.

According to an embodiment of the invention, the contact hole of the insulation layer is located outside the drain, and the test electrode is electrically connected to the drain of the TFT through the pixel electrode.

According to an embodiment of the invention, each of the pixel units further includes an etching protection pattern. The etching protection pattern is located between the contact hole of the insulation layer and the pixel electrode and is in contact with the pixel electrode. The contact hole of the insulation layer is filled with the test electrode, and the test electrode is in contact with the etching protection pattern.

According to an embodiment of the invention, the etching protection pattern and the drain of the TFT belong to the same film layer.

According to an embodiment of the invention, the etching protection pattern and the drain of the TFT are separated from each other.

According to an embodiment of the invention, the contact hole of the insulation layer exposes an overlapping portion of the drain and the pixel electrode, and the contact hole is filled with the test electrode in contact with the drain.

According to an embodiment of the invention, each of the pixel units further includes a scan line and a data line. The scan line is electrically connected to the gate, and the data line is electrically connected to the source. The scan line shields the contact hole of the insulation layer and the test electrode.

As discussed above, in the pixel array substrate and the display panel provided in an embodiment of the invention, the pixel electrode of each pixel unit is exposed by the contact hole of the insulation layer, and each pixel unit includes the test electrode that fills the contact hole and is electrically connected to the TFT. Hence, testers can easily enable the probe to be in contact with the test electrode of each pixel unit, so as to measure the electrical properties of the TFT. As a result, the conventional issue that the electrical properties of the TFT are not apt to be measured because the pixel electrode is blocked by the insulation layer may be resolved.

Several exemplary embodiments accompanied with figures are described in detail below to further describe the invention in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the invention.

DETAILED DESCRIPTION OF DISCLOSED EMBODIMENTS

Figure 1:
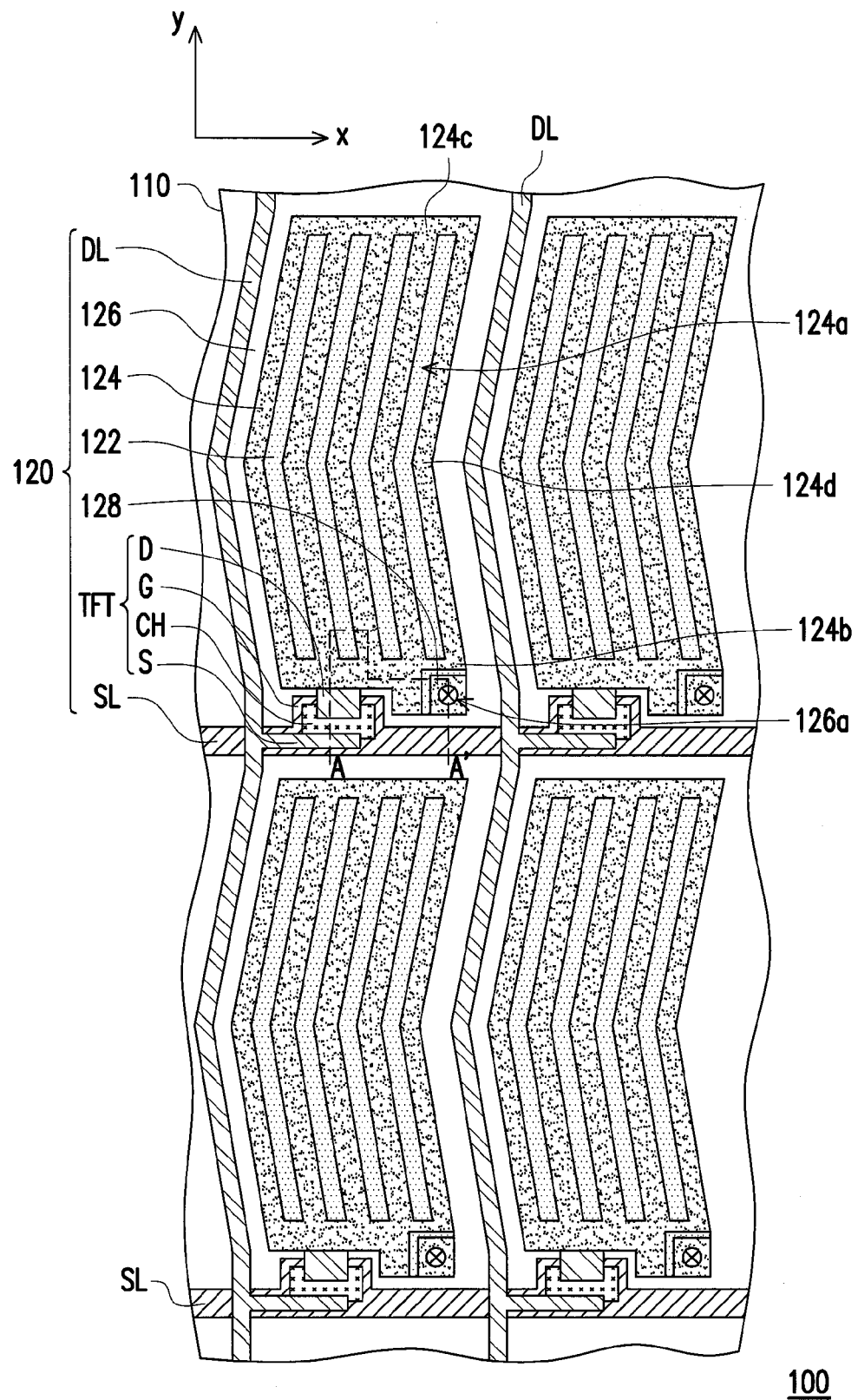
FIG. 1 is a schematic top view illustrating a pixel array substrate according to an embodiment of the invention.
Figure 2:
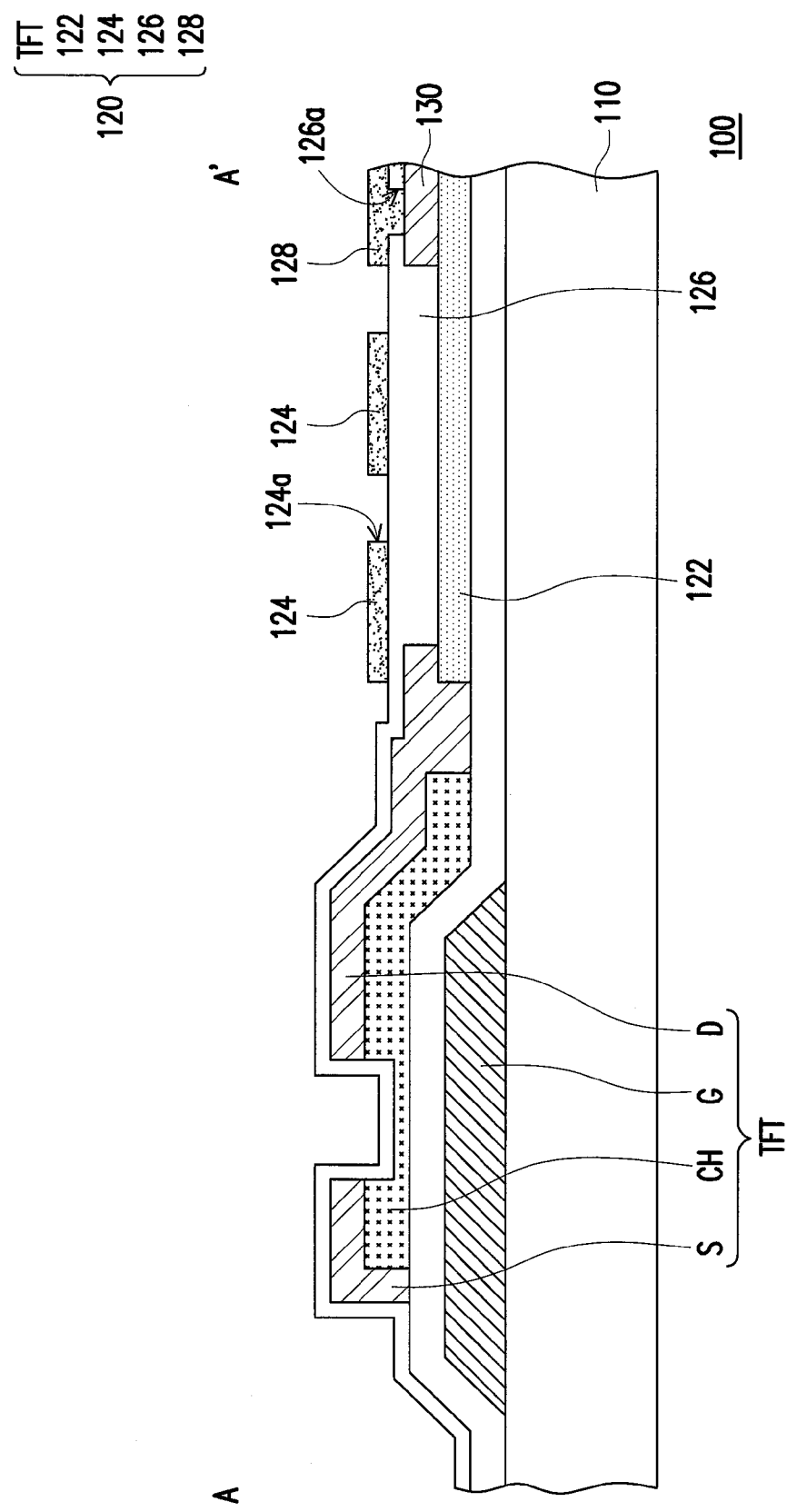
FIG. 2 is a schematic cross-sectional view illustrating the pixel array substrate taken along a section line A-A' depicted in FIG. 1.

FIG. 1 is a schematic top view illustrating a pixel array substrate according to an embodiment of the invention. FIG. 2 is a schematic cross-sectional view illustrating the pixel array substrate taken along a section line A-A' depicted in FIG. 1. With reference to FIG. 1 and FIG. 2, a pixel array substrate 100 described in the present embodiment includes a substrate 110 and a plurality of pixel units 120 arranged in an array on the substrate 110. Each of the pixel units 120 includes a thin film transistor TFT, a pixel electrode 122 electrically connected to a drain D of the thin film transistor TFT, a common electrode 124, and an insulation layer 126.

The thin film transistor TFT has a source S, a gate G, the drain D, and a channel CH. The source S and the drain D are located at two respective sides of the channel CH, and the channel CH, the source S, and the drain D are overlapped with the gate G. In the present embodiment, the gate G is located between the channel CH and the substrate 110, and the channel CH is located between the source S and the gate G. That is, the thin film transistor TFT described herein may be a bottom gate thin film transistor. Nonetheless, the invention is not limited thereto. In other embodiments, the thin film transistor TFT can also be a top gate thin film transistor or can be in another appropriate form.

The pixel electrode 122 is located between the common electrode 124 and the substrate 110. Namely, the common electrode 124 is above the pixel electrode 122. According to the present embodiment, the pixel structure 122 does not have any opening therein. That is, the pixel electrode 122 may be a complete conductive pattern. For instance, the pixel electrode 122 may be a complete conductive pattern shaped as a tilted letter L ("〈"). However, the invention is not limited to the above descriptions. In another embodiment of the invention, the pixel electrode 122 may be a rectangular conductive pattern or a conductive pattern shaped in any other appropriate manner. In the present embodiment, the pixel electrode 122 is, for instance, a transparent conductive pattern that is made of metal oxide, e.g., indium tin oxide (ITO), indium zinc oxide (IZO), aluminum tin oxide (ATO), aluminum zinc oxide (AZO), indium germanium zinc oxide (IGZO), other suitable oxides, or a stacked layer having at least two of the above. However, the invention is not limited thereto. If the display panel having the pixel array substrate 100 is a reflective display panel, the pixel electrode 122 may also be made of a highly reflective conductive material, e.g., metal, alloy, metal nitride, metal oxide, metal oxynitride, or a stacked layer having metal and other conductive materials.

The common electrode 124 has a plurality of slits 124a exposing the pixel electrode 122. Specifically, in the present embodiment, as shown in FIG. 1, the common electrode 124 includes a first branch 124b whose extension direction is parallel to an extension direction of the scan line SL, a second branch 124c, and a plurality of third branches 124d whose extension directions are parallel to an extension direction of the data line DL. Compared to the second branch 124c, the first branch 124a is rather close to the corresponding thin film transistor TFT. The first branch 124b and the drain D of the corresponding thin film transistor TFT are overlapped. The third branches 124d are connected to the first branch 124b and the second branch 124c. Two adjacent third branches 124d, the first branch 124b, and the second branch 124c together define one slit 124a. In the present embodiment, the slit 124a may be an opening shaped as a tilted letter L ("〈"). However, the invention is not limited to the above descriptions. In another embodiment of the invention, the slit 124a may be a rectangular opening or an opening shaped in any other appropriate manner. In the present embodiment, the common electrode 124 is, for instance, a transparent conductive pattern that is made of metal oxide, e.g., ITO, IZO, ATO, AZO, IGZO, other suitable oxides, or a stacked layer having at least two of the above. However, the invention is not limited thereto. If the display panel having the pixel array substrate 100 is a reflective display panel, the common electrode 124 may also be made of a highly reflective conductive material, e.g., metal, alloy, metal nitride, metal oxide, metal oxynitride, or a stacked layer having metal and other conductive materials.

As shown in FIG. 2, the insulation layer 126 is located between the common electrode 124 and the pixel electrode 122. According to the present embodiment, the insulation layer 126 may be made of an inorganic material (e.g., silicon oxide, silicon nitride, silicon oxynitride, or a stacked layer having at least two of the above-mentioned materials), an organic material, or a combination thereof. It should be mentioned that the insulation layer 126 has a contact hole 126a that exposes the pixel electrode 122, as shown in FIG. 1 and FIG. 2. In the present embodiment, the contact hole 126a of the insulation layer 126 may be located outside the drain D. For instance, as shown in FIG. 1, the contact hole 126a may be located between the first branch 124b of the common electrode 124 and the corresponding scan line SL. Namely, in the present embodiment, the contact hole 126a may be located above the lower-right corner of the pixel electrode 122 exposed by the common electrode 124. Note that the contact hole 126a may also be located in another appropriate place, which will be exemplified hereinafter.

With reference to FIG. 1 and FIG. 2, each of the pixel units 120 further includes a test electrode 128. The test electrode 128 is separated from the common electrode 124. That is, the test electrode 128 is electrically independent from the common electrode 124. As shown in FIG. 2, the contact hole 126a of the insulation layer 126 is filled with the test electrode 128, and the test electrode 128 is electrically connected to the drain D of the thin film transistor TFT. Namely, in the present embodiment, the test electrode 128 is electrically connected to the drain D of the thin film transistor TFT through the pixel electrode 122. Note that the invention is not limited thereto, and the test electrode 128 may also be connected to the drain D of the thin film transistor TFT in another manner, which will be exemplified hereinafter.

Through the test electrode 128, testers are able to measure the electrical properties of each thin film transistor TFT without being blocked by the insulation layer 126, i.e., the testers can easily enable one probe to be in contact with the outermost test electrode 128 of the pixel array substrate 100, so as to measure the electrical properties of the corresponding thin film transistor TFT through the test electrode 128 electrically connected to the drain D. As a result, in the pixel array substrate 100 described in the present embodiment, the conventional issue that the electrical properties of the thin film transistor TFT are not apt to be measured because the pixel electrode is blocked by the insulation layer may be resolved. In addition, the test electrode 128 and the common electrode 124 belong to the same film layer, i.e., the test electrode 128 and the common electrode 124 may be formed with use of one photomask. Hence, while the test electrode 128 is formed to measure the electrical properties of the thin film transistor TFT, the formation of the test electrode 128 does not raise the manufacturing cost of the pixel array substrate 100.

With reference to FIG. 1 and FIG. 2, in the present embodiment, each pixel unit 120 may selectively include an etching protection pattern 130 (shown in FIG. 2). The etching protection pattern 130 is located between the contact hole 126a of the insulation layer 126 and the pixel electrode 122 and is in contact with the pixel electrode 122. In the present embodiment, the etching protection pattern 130 may be selectively separated from the drain D of the thin film transistor TFT. The contact hole 126a of the insulation layer 126 may be filled with the test electrode 126 that is in contact with the etching protection pattern 130 according to the present embodiment, and the test electrode 128 may then be electrically connected to the drain D of the thin film transistor TFT sequentially through the etching protection pattern 130 and the pixel electrode 122.

Since the etching protection pattern 130 covers the pixel electrode 122, the etchant applied for etching the insulation layer 126 is stopped by the etching protection pattern 130 during the formation of the contact hole 126a; thereby, the pixel electrode 122 below the contact hole 126a is not apt to be damaged, and the resultant pixel array substrate 100 may have high yield. It should be mentioned that it is not necessary for the pixel unit 120 to include the etching protection pattern 130. In another embodiment of the invention, if the etchant applied for etching the insulation layer 126 cannot easily impair the pixel electrode 122, it is likely for the pixel unit 120 not to include the etching protection pattern 130.

According to the present embodiment, the etching protection pattern 130, the drain D of the thin film transistor TFT, and the source S thereof may belong to the same film layer, i.e., the etching protection pattern 130, the drain D of the thin film transistor TFT, and the source S thereof may be formed with use of one photomask. Hence, the formation of the etching protection pattern 130 does not raise the manufacturing cost of the pixel array substrate 100. However, the invention is not limited thereto, and the etching protection pattern 130 may not be formed together with the drain D and the source S of the thin film transistor TFT according to other embodiments of the invention. For instance, in another embodiment, if the thin film transistor TFT is a top gate thin film transistor, the etching protection pattern 130 may be formed together with the gate G of the thin film transistor TFT.

As shown in FIG. 1, in the present embodiment of the invention, each of the pixel units 120 further includes a scan line SL and a data line DL. The scan line SL is electrically connected to the gate G of the thin film transistor TFT, and the data line DL is electrically connected to the source S of the thin film transistor TFT. The scan lines SL and the data lines are alternately arranged. In the pixel array substrate 100, two adjacent scan lines SL and two adjacent data lines DL may define the pixel electrode 122 of one of the pixel units 120. The pixel units 120 are arranged in an array along row directions x and column directions y, and the row directions x are perpendicular to the column directions y. One scan line SL may be arranged between the electrodes 122 of the pixel units 120 in two adjacent rows. One data line DL may be arranged between the electrodes 122 of the pixel units 120 in two adjacent columns. Namely, the pixel array substrate 100 described in the present embodiment has the commonly known single-gate structure. However, the invention is not limited thereto, and the pixel array substrate in other embodiments may have another appropriate structure, which will be described below with reference to FIG. 3 and FIG. 4.

Figure 3:
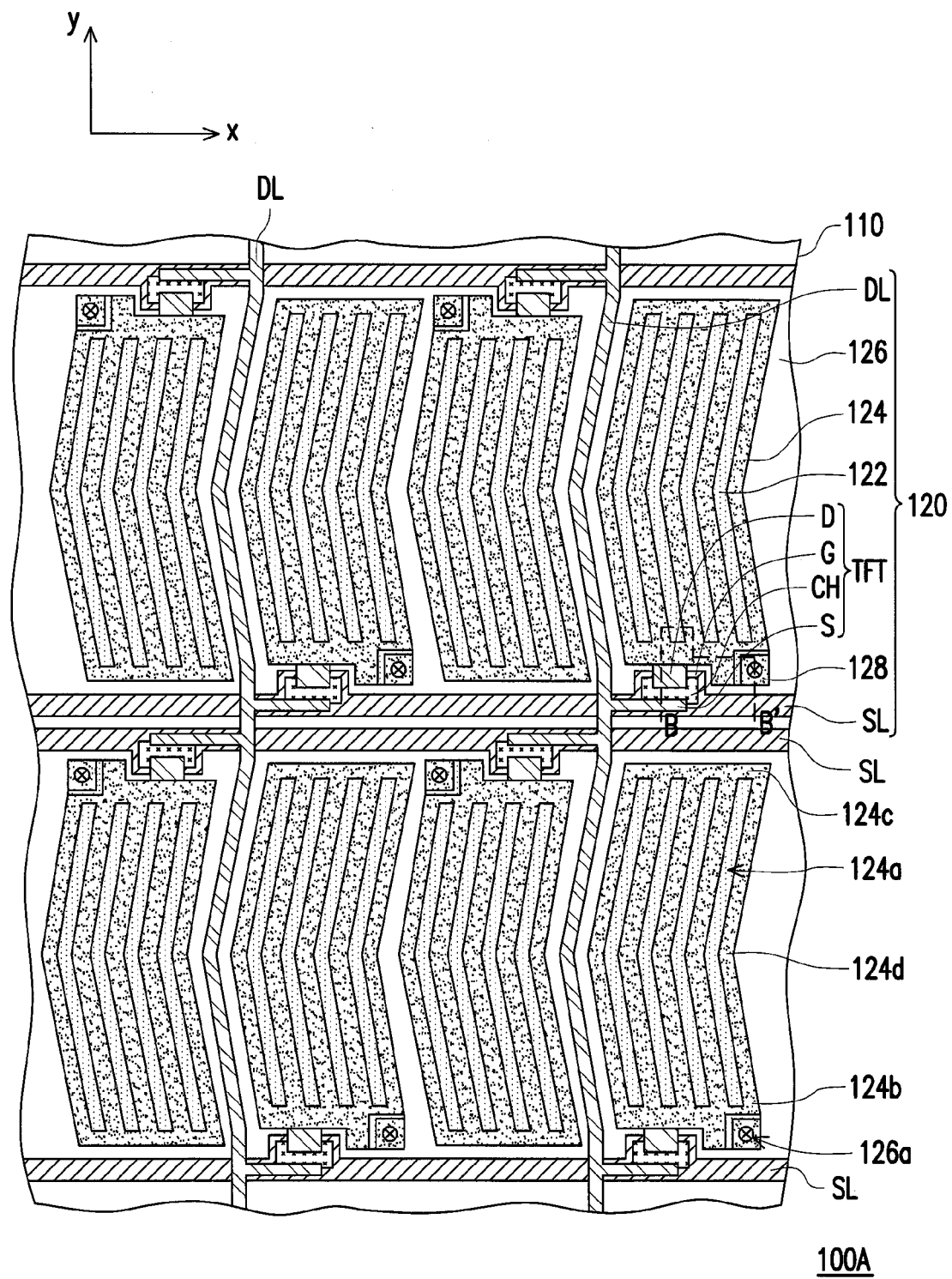
FIG. 3 is a schematic top view illustrating a pixel array substrate according to another embodiment of the invention.
Figure 4:
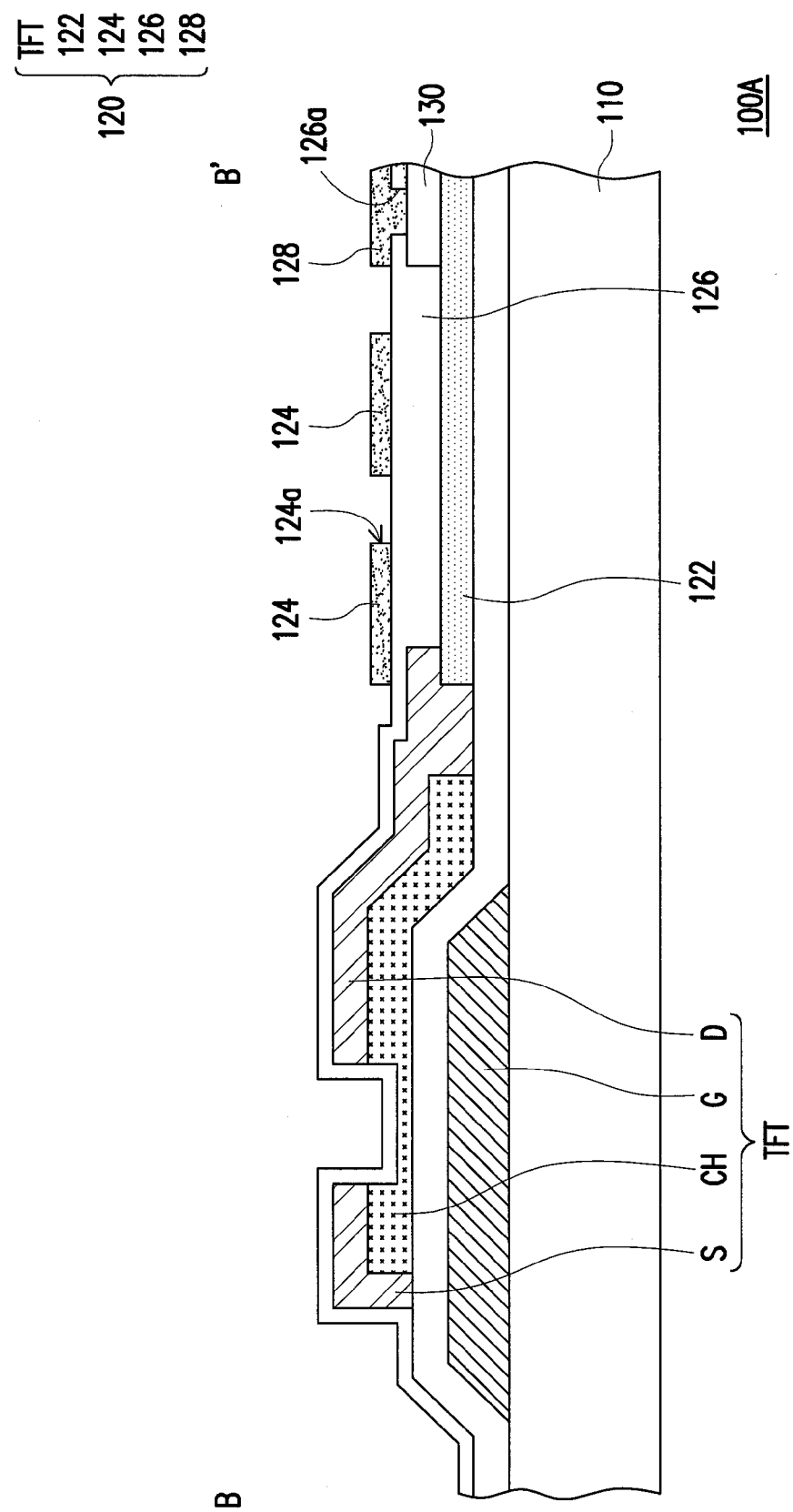
FIG. 4 is a schematic cross-sectional view illustrating the pixel array substrate taken along a section line B-B' depicted in FIG. 3.

FIG. 3 is a schematic top view illustrating a pixel array substrate according to another embodiment of the invention. FIG. 4 is a schematic cross-sectional view illustrating the pixel array substrate taken along a section line B-B' depicted in FIG. 3. With reference to FIG. 3 and FIG. 4, the pixel array substrate 100A described in the present embodiment is similar to the pixel array substrate 100 described above, and thus the same and corresponding components of the two pixel array substrates 100 and 100A are represented by the same or corresponding reference numbers. The differences between the two pixel array substrates 100 and 100A are described hereinafter, while the similarities therebetween can be referred to as those described above and shown in FIG. 3 and FIG. 4. Accordingly, no repetitive descriptions are given hereinafter.

The differences between the pixel array substrate 100A and the pixel array substrate 100 lie in that "two" scan lines SL may be configured between the pixel electrodes 122 of the pixel units 120 arranged in two adjacent rows in the pixel array substrate 100A. Besides, there may be no data line DL between the pixel electrodes 122 of the pixel units 120 arranged in some of the two adjacent columns, while one data line DL may be configured between the pixel electrodes 122 of the pixel units 120 arranged in some of adjacent columns. Namely, the pixel array substrate 100A described in the present embodiment has the commonly known dual-gate structure. Since the effects and the advantages of the pixel array substrate 100A are similar to those of the pixel array substrate 100, no relevant descriptions will be provided hereinafter.

Figure 5:
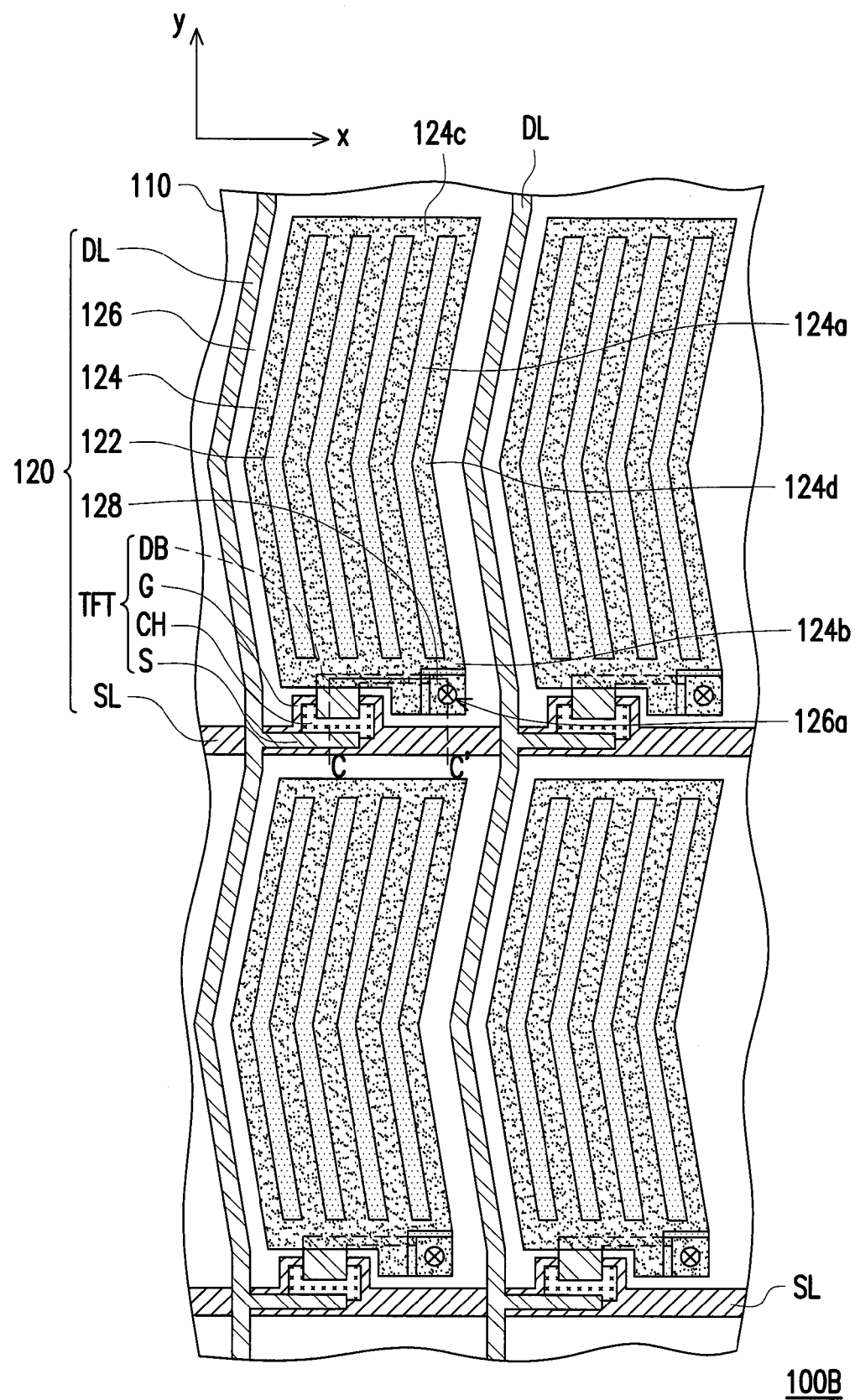
FIG. 5 is a schematic top view illustrating a pixel array substrate according to another embodiment of the invention.
Figure 6:
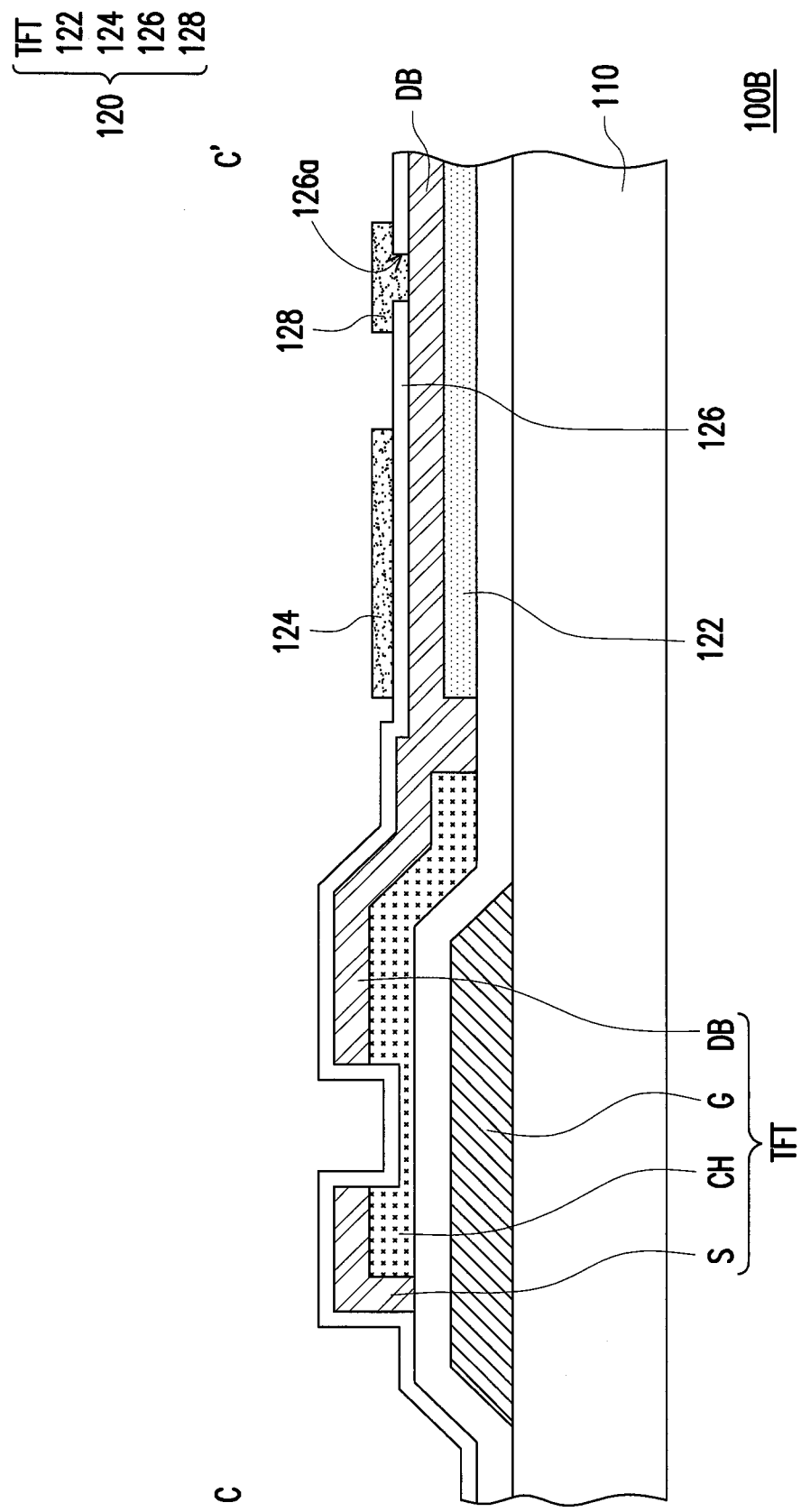
FIG. 6 is a schematic cross-sectional view illustrating the pixel array substrate taken along a section line C-C' depicted in FIG. 5.

FIG. 5 is a schematic top view illustrating a pixel array substrate according to another embodiment of the invention. FIG. 6 is a schematic cross-sectional view illustrating the pixel array substrate taken along a section line C-C' depicted in FIG. 5. With reference to FIG. 5 and FIG. 6, the pixel array substrate 100B described in the present embodiment is similar to the pixel array substrate 100 described above, and thus the same and corresponding components of the two pixel array substrates 100 and 100B are represented by the same or corresponding reference numbers. The differences between the two pixel array substrates 100 and 100B are described hereinafter, while the similarities therebetween can be referred to as those described above and shown in FIG. 5 and FIG. 6. Accordingly, no repetitive descriptions are given hereinafter.

The differences between the pixel array substrate 100B and the pixel array substrate 100 lie in that the pixel array substrate 100B may not include the etching protection pattern 130 of the pixel array substrate 100, and the drain DB of the thin film transistor TFT is extended below the contact hole 126a of the insulation layer 126 to replace the etching protection pattern 130. In particular, the contact hole 126a of the insulation layer 126 exposes an overlapping portion of the drain DB and the pixel electrode 122, and the contact hole 126a may be filled with the test electrode 128 that is in direct contact with the drain DB. Since the test electrode 128 is in direct contact with the drain DB, the resistance between the drain DB and the probe that is applied for measuring the electrical properties of the thin film transistor TFT may be minimized, and thus the measurement result of the electrical properties of the thin film transistor TFT tends to be accurate.

Figure 7:
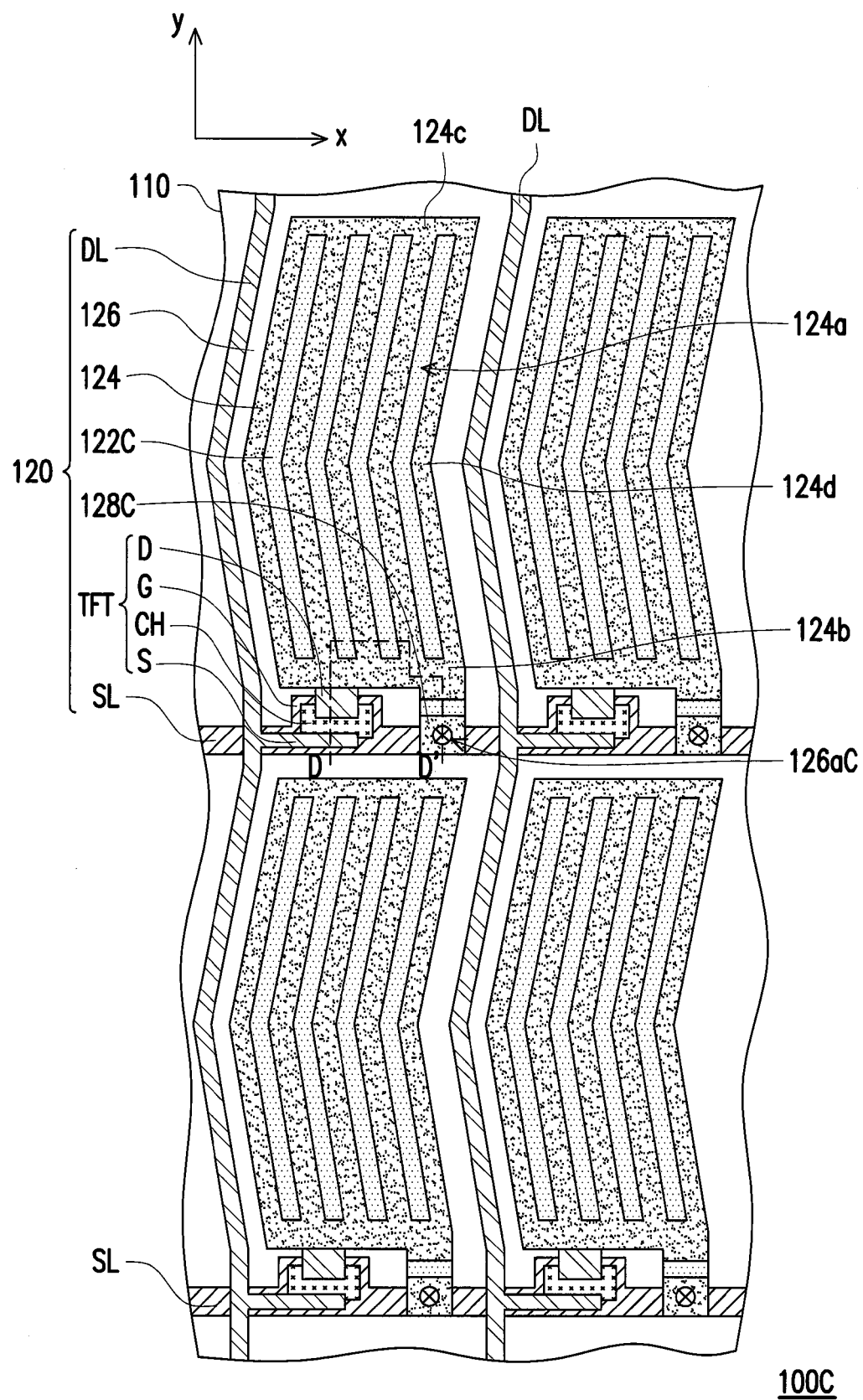
FIG. 7 is a schematic top view illustrating a pixel array substrate according to another embodiment of the invention.
Figure 8:
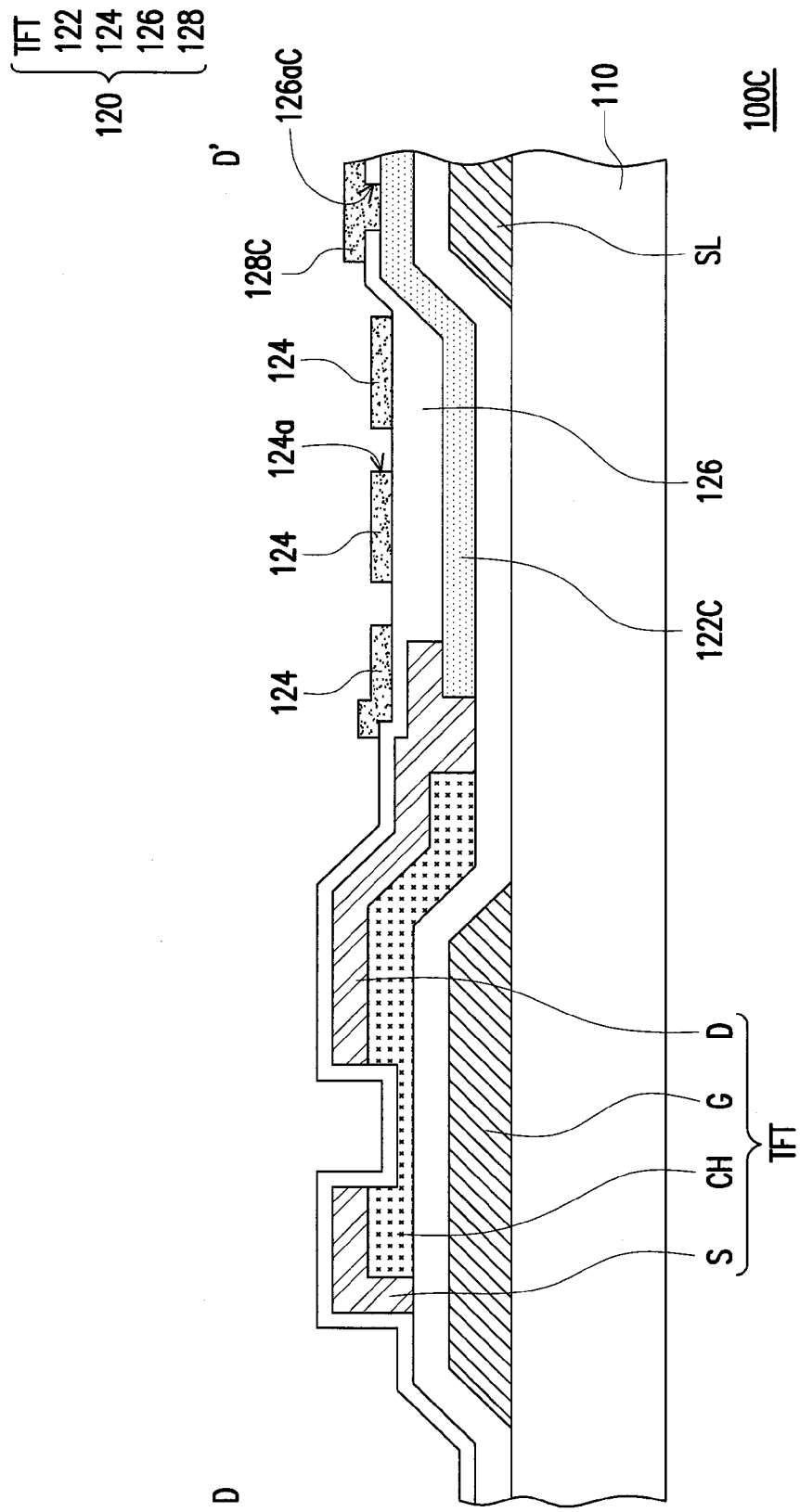
FIG. 8 is a schematic cross-sectional view illustrating the pixel array substrate taken along a section line D-D' depicted in FIG. 7.

FIG. 7 is a schematic top view illustrating a pixel array substrate according to another embodiment of the invention. FIG. 8 is a schematic cross-sectional view illustrating the pixel array substrate taken along a section line D-D' depicted in FIG. 7. With reference to FIG. 7 and FIG. 8, the pixel array substrate 100C described in the present embodiment is similar to the pixel array substrate 100 described above, and thus the same and corresponding components of the two pixel array substrates 100 and 100C are represented by the same or corresponding reference numbers. The differences between the two pixel array substrates 100 and 100C are described hereinafter, while the similarities therebetween can be referred to as those described above and shown in FIG. 7 and FIG. 8. Accordingly, no repetitive descriptions are given hereinafter.

The differences between the pixel array substrate 100C and the pixel array substrate 100 lie in that the pixel electrode 122C of each pixel unit 120 in the pixel array substrate 100C is not completely surrounded by two adjacent data lines DL and two adjacent scan lines SL. Particularly, in the pixel array substrate 100C, the pixel electrode 122C of each pixel unit 120 may be extended to the area above one of the scan lines SL from the region surrounded by two adjacent data lines DL and two adjacent scan lines SL. Additionally, in the pixel array substrate 100C, the locations of the contact hole 126aC and the test electrode 128C are also different from those of the contact hole 126a and the test electrode 128. To be specific, in the pixel array substrate 100C, the contact hole 126aC and the test electrode 128C of each pixel unit 120 may be located above a portion of the pixel electrode 122C extending above the scan line SL. Thereby, the scan line SL is able to cover the contact hole 126aC of the insulation layer 126 and the test electrode 128C filling the contact hole 126aC, and thus the test electrode 128C does not pose a significant impact on the aperture ratio of the pixel array substrate 100C.

It should be mentioned that the pixel array substrates shown in FIG. 1 to FIG. 8 serve to elaborate the invention instead of limiting the invention. It is not necessary for the pixel units of the pixel array substrate described herein to be structurally identical to one another. The pixel units shown in FIG. 1 to FIG. 8 may be combined in any manner and arranged on the same substrate, so as to constitute the pixel array substrate described in an embodiment of the invention. Furthermore, the structures of the pixel array substrates 100B and 100C respectively shown in FIG. 5 and FIG. 7 are not limited to the single-gate structures; the pixel units 120 shown in FIG. 5 and FIG. 7 may also be applied in the dual-gate structure shown in FIG. 3 and may be deduced by people having ordinary skill in the art based on the teachings of the above embodiments, and therefore detailed descriptions are omitted hereinafter.

Figure 9:
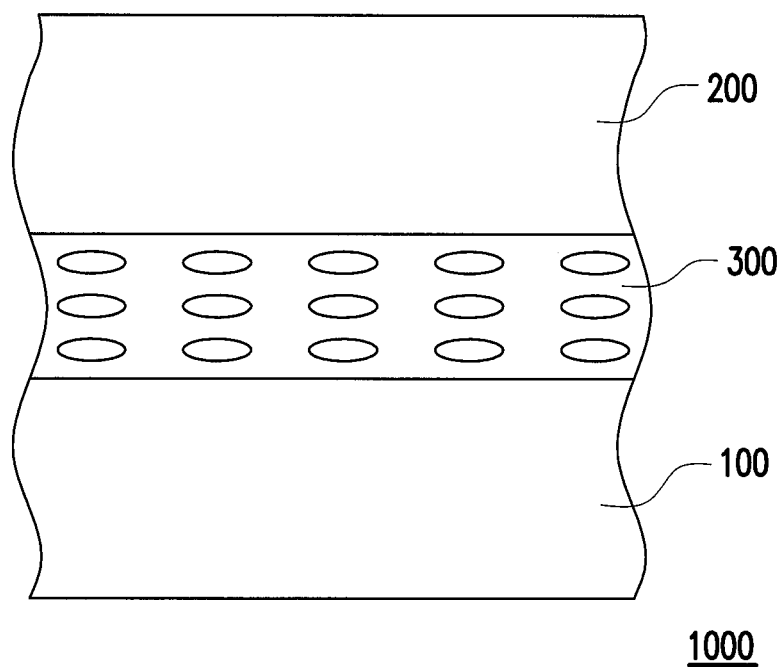
FIG. 9 is a schematic cross-sectional view illustrating a display panel according to an embodiment of the invention.

FIG. 9 is a schematic cross-sectional view illustrating a display panel according to an embodiment of the invention. With reference to FIG. 9, a display panel 1000 includes the pixel array substrate 100, an opposite substrate 200 arranged opposite the pixel array substrate 100, and a display medium 300 located between the pixel array substrate 100 and the opposite substrate 200. When the display panel 1000 cannot display images with favorable quality, the testers separate the pixel array substrate 100 from the opposite substrate 200 and then will be able to measure the electrical properties of each thin film transistor TFT through the test electrode 128 electrically connected to the drain D of each thin film transistor TFT, so as to analyze and obtain the real cause of the unfavorable display. Note that the pixel array substrate of the display panel 1000 includes but is not limited to the pixel array substrate 100 shown in FIG. 1 and FIG. 2. In other embodiments of the invention, the he pixel array substrate of the display panel 1000 may also be the pixel array substrate 100A shown in FIG. 3 (and FIG. 4), the pixel array substrate 100B shown in FIG. 5 (and FIG. 6), and the pixel array substrate 100C shown in FIG. 7 (and FIG. 8).

To sum up, in the pixel array substrate provided in an embodiment of the invention, the pixel electrode of each pixel unit is exposed by the contact hole of the insulation layer, and each pixel unit includes the test electrode that fills the contact hole and is electrically connected to the thin film transistor. Hence, testers can easily enable the probe to be in contact with the test electrode of each pixel unit, so as to measure the electrical properties of the thin film transistor. As a result, the conventional issue that the electrical properties of the thin film transistor are not apt to be measured because the pixel electrode is blocked by the insulation layer may be resolved. Moreover, the display panel provided in an embodiment of the invention includes said pixel array substrate; therefore, when the display panel cannot display images with favorable quality, the testers separate the pixel array substrate from the opposite substrate and then will be able to measure the electrical properties of each thin film transistor, so as to analyze and obtain the real cause of the unfavorable display.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A pixel array substrate comprising:
   a substrate; and
   a plurality of pixel units located in an array on the substrate, each of the pixel units comprising:
   a thin film transistor having a source, a gate, and a drain;
   a pixel electrode electrically connected to the drain of the thin film transistor;
   a common electrode, the pixel electrode being located between the common electrode and the substrate, the common electrode having a plurality of slits exposing the pixel electrode;
   an insulation layer located between the common electrode and the pixel electrode, the insulation layer having a contact hole exposing the pixel electrode; and
   a test electrode, the common electrode and the test electrode belonging to a same film layer and being separated from each other, the contact hole of the insulation layer being filled with the test electrode electrically connected to the drain of the thin film transistor, wherein the same film layer is a single material layer.

2. The pixel array substrate as recited in claim 1, wherein the contact hole of the insulation layer is located outside the drain, and the test electrode is electrically connected to the drain of the thin film transistor through the pixel electrode.

3. The pixel array substrate as recited in claim 2, wherein each of the pixel units further comprises:
   an etching protection pattern located between the contact hole of the insulation layer and the pixel electrode, the etching protection pattern being in contact with the pixel electrode, the contact hole of the insulation layer being filled with the test electrode in contact with the etching protection pattern.

4. The pixel array substrate as recited in claim 3, wherein the etching protection pattern and the drain of the thin film transistor belong to the same film layer.

5. The pixel array substrate as recited in claim 4, wherein the etching protection pattern and the drain of the thin film transistor are separated from each other.

6. The pixel array substrate as recited in claim 1, wherein the contact hole of the insulation layer exposes an overlapping portion of the drain and the pixel electrode, and the contact hole is filled with the test electrode in contact with the drain.

7. The pixel array substrate as recited in claim 1, wherein each of the pixel units further comprises a scan line and a data line, the scan line is electrically connected to the gate and shields the contact hole of the insulation layer and the test electrode, and the data line is electrically connected to the source.

8. A display panel comprising:
a pixel array substrate comprising:
a substrate; and
a plurality of pixel units located in an array on the substrate, each of the pixel units comprising:
   a thin film transistor having a source, a gate, and a drain;
   a pixel electrode electrically connected to the drain of the thin film transistor;
   a common electrode, the pixel electrode being located between the common electrode and the substrate, the common electrode having a plurality of slits exposing the pixel electrode;
   an insulation layer located between the common electrode and the pixel electrode, the insulation layer having a contact hole exposing the pixel electrode; and
   a test electrode, the common electrode and the test electrode belonging to a same film layer and being separated from each other, the contact hole of the insulation layer being filled with the test electrode electrically connected to the drain of the thin film transistor, wherein the same film layer is a single material layer;
an opposite substrate arranged opposite to the pixel array substrate; and
a display medium located between the pixel array substrate and the opposite substrate.

9. The display panel as recited in claim 8, wherein the contact hole of the insulation layer is located outside the drain, and the test electrode is electrically connected to the drain of the thin film transistor through the pixel electrode.

10. The display panel as recited in claim 9, wherein the each of the pixel units further comprises:
an etching protection pattern located between the contact hole of the insulation layer and the pixel electrode, the etching protection pattern being in contact with the pixel electrode, the contact hole of the insulation layer being filled with the test electrode in contact with the etching protection pattern.

11. The display panel as recited in claim 10, wherein the etching protection pattern and the drain of the thin film transistor belong to the same film layer.

12. The display panel as recited in claim 11, wherein the etching protection pattern and the drain of the thin film transistor are separated from each other.

13. The display panel as recited in claim 8, wherein the contact hole of the insulation layer exposes an overlapping portion of the drain and the pixel electrode, and the contact hole is filed with the test electrode in contact with the drain.

14. The display panel as recited in claim 8, wherein each of the pixel units further comprises a scan line and a data line, the scan line is electrically connected to the gate and shields the contact hole of the insulation layer and the test electrode, and the data line is electrically connected to the source.

* * * * *